Figure 1:
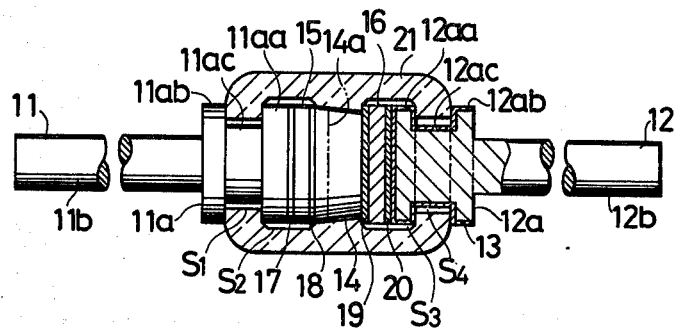

United States Patent [19]
Itoh et al.

[11] 4,153,910
[45] May 8, 1979

[54] MOLDED SEMICONDUCTOR DEVICE WITH HEADER LEADS

[75] Inventors: Seiichi Itoh; Kensuke Suzuki, both of Ibaraki, Japan

[73] Assignee: Hitachi, Ltd., Japan

[21] Appl. No.: 810,164

[22] Filed: Jun. 27, 1977

[30] Foreign Application Priority Data

Jun. 26, 1976 [JP]  Japan .................. 51-75872

[51] Int. Cl.² .................. H01L 23/48; H01L 29/44; H01L 29/52
[52] U.S. Cl. ........................ 357/68; 357/72; 357/73; 357/74; 357/71
[58] Field of Search .............. 357/72, 73, 74, 68

[56] References Cited

U.S. PATENT DOCUMENTS

| | | | |
|---|---|---|---|
| 2,726,357 | 12/1955 | Sachs | 357/72 |
| 3,081,374 | 3/1963 | Burch | 357/72 |
| 3,237,272 | 3/1966 | Kallander | 357/73 |
| 3,476,988 | 11/1969 | Zido | 357/72 |
| 3,844,029 | 10/1974 | Dibugnara | 357/72 |
| 3,913,127 | 10/1975 | Suzuki et al. | 357/73 |
| 3,996,602 | 12/1976 | Goldberg et al. | 357/73 |
| 4,059,837 | 11/1977 | Suzuki et al. | 357/73 |

*Primary Examiner*—Andrew J. James
*Attorney, Agent, or Firm*—Craig & Antonelli

[57] ABSTRACT

Header leads in a molded semiconductor device according to this invention are composed of electrode portions for securing a semiconductor pellet, and lead portions for connection. Each of the electrode portions is constructed of two tabular header portions separated from each other, and a columnar neck portion coupling both the header portions between opposing surfaces thereof. The lead portion is joined to one of the tubular header portions so that the lead portion and the columnar neck portion may extend coaxially. The cross-sectional area of the columnar neck portion in a direction orthogonal to the direction of the axis is larger than the cross-sectional area of the lead portion in the orthogonal direction. The semiconductor pellet is secured to the other header portion of each electrode portion. A mold material covers the entire periphery of the device from the semiconductor pellet to the one header portion of the electrode portion.

24 Claims, 7 Drawing Figures

MOLDED SEMICONDUCTOR DEVICE WITH HEADER LEADS

The present invention relates to a molded semiconductor device. More particularly, it relates to a molded semiconductor device with header lead type electrode leads in which an electrode member for supporting and securing a semiconductor pellet and a lead member for connecting the electrode member to another circuit element or a terminal are integrally formed of an identical metal.

A semiconductor device is so constructed that a semiconductor pellet is encapsulated in an airtight envelope. This serves to maintain the reliability of the semiconductor device by preventing infliction of mechanical damage on the semiconductor pellet, and by isolating the semiconductor pellet from harmful impurities in the surrounding environment or atmospheric air.

One method for constructing the airtight envelope is to mold the semiconductor pellet in an epoxy resin or glass. The glass can function as a surface stabilizing material for the exposed part of the p-n junction of the semiconductor pellet by an appropriate selection of the composition of the glass. Accordingly, airtight encapsulation is achieved by baking such glass directly on the entire semiconductor pellet. Then, the semiconductor device can be simplified and miniaturized, and its manufacturing process can be simplified.

In the case of molding the semiconductor pellet with epoxy resin or the like, the exposed part of the p-n junction is first covered with a surface stabilizing material such as silicone rubber, and then, the semiconductor pellet is molded with the epoxy resin or the like. Resin molding only requires the step of coating with the surface stabilizing material added, as compared with glass molding, and it accomplishes substantially the same effect as occurs in the case of glass molding.

For electrodes for supporting and fixing the semiconductor pellet through a bonding solder, molybdenum or tungsten whose coefficient of thermal expansion is approximate to that of the semiconductor pellet have been used. These electrode materials prevent the semiconductor pellet from being destroyed by thermal stresses attributed to heating at the fixation of the electrodes. Molybdenum or tungsten is effective as the electrode material from the viewpoint of the coefficient of thermal expansion, but disadvantageously both materials are expensive.

A connecting lead made of copper is often attached to the molybdenum or tungsten electrode by welding. However, a weld between these members is inferior, and enhancement of the corrosion resistance of the welded part becomes an important consideration. It is therefore desirable that the electrode and the lead be formed of an identical metal.

In general, the molding material does not mold only the semiconductor pellet, but it also molds the electrodes together. A bending stress applied to the lead portion can be transmitted to the electrode portion. When such a bending stress is excessively strong, glass will rupture in the glass-molded semiconductor device, and a separation occurs between the molding resin and the electrode member in the resin-molded semiconductor device. In either case, airtightness is destroyed. In such molded semiconductor devices, accordingly, it is required that airtightness not be lost by bending stresses exerted on the lead.

A semiconductor device generates heat in the semiconductor pellet during its operation, and it is necessary to radiate the generated heat. Further, it is desirable that heat generation be low at parts other than the semiconductor pellet, such as at the electrodes and leads. Also, it is necessary to radiate heat which is produced in the semiconductor pellet by an instantaneous overcurrent flowing through the semiconductor pellet, i.e., a surge current. Thus, the surge current withstand property must be larger if a higher surge current is permitted to flow.

An object of this invention is to provide a molded semiconductor device whose electrode and lead are integrally formed, which is excellent in corrosion resistance and economy, and in which no thermal stresses act on a semiconductor pellet of the device.

Another object of this invention is to provide a molded semiconductor device which maintains airtightness, even though bending stresses act on a lead.

Still another object of this invention is to provide a molded semiconductor device which exhibits good heat radiating properties and has a high withstand surge voltage.

The molded semiconductor device of this invention is characterized in that electrodes for securing a semiconductor pellet and leads for connection to the electrodes are integrally formed, that each of the electrodes is constructed of two tabular header portions separated from each other and a columnar neck portion coupling both the header portions between opposing surfaces thereof, that a lead portion is joined to one of the header portions of the electrodes so that the lead portion and the columnar neck portion may extend coaxially, that the cross-sectional area of the columnar neck portion of the electrodes in a direction orthogonal to the axis is larger that that of the lead portion, that the semiconductor pellet is secured to the other header portion of each of the electrodes, and that a molding material is disposed over from the semiconductor pellet to the one header portion of each of the electrodes so as to entirely cover both the pellet and the electrodes.

Figure 2:
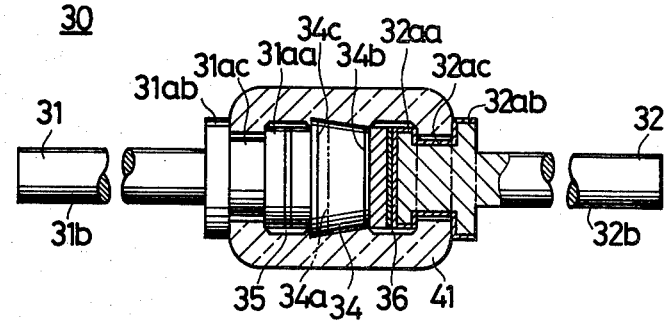
Figure 3:
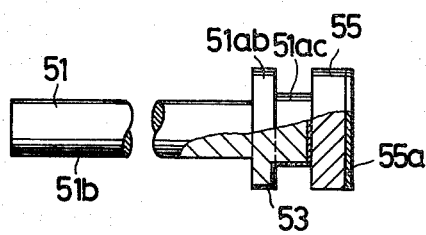
Figure 4:
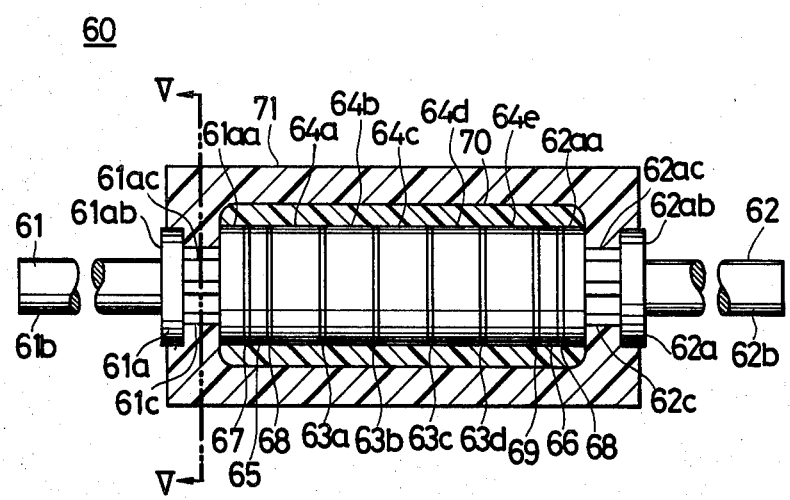
Figure 5:
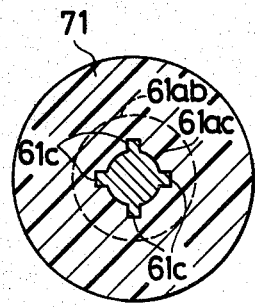
Figure 7:
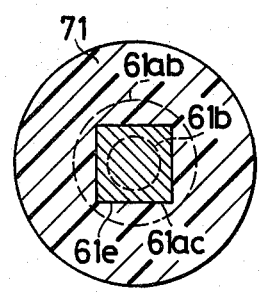
Figure 6:

These and other objects, features, and advantages of the present invention will become more apparent from the following description when taken in connection with the accompanying drawing figures, which show for purposes of illustration only several embodiments in accordance with the present invention, and wherein:

FIG. 1 is a vertical sectional view of a glass-molded diode showing an embodiment of this invention, FIG. 2 is a vertical sectional view of a glass-molded diode showing another embodiment of this invention, FIG. 3 is a partial sectional view of an electrode lead for use in the semiconductor device of this invention, FIG. 4 is a vertical sectional view of a resin-molded diode showing still another embodiment of this invention, FIG. 5 is a cross-sectional view taken along line V—V in FIG. 4, and FIGS. 6 and 7 are cross-sectional views of resin-molded diodes showing further embodiments of this invention.

Referring to FIG. 1, a glass-molded diode 10 is provided according to this invention. A pair of electrode leads 11 and 12 are molded into the same shape, and include electrode portions 11a, 12a and lead portions 11b, 12b. Further, the electrode portions 11a, 12a have header portions 11aa, 12aa for securing a silicon pellet 14 to be described later, header portions 11ab, 12ab at positions spaced by a predetermined distance from the header portions 11aa, 12aa, and neck portions 11ac, 12ac coupling both the header portions. Hereafter, for the sake of brevity in the description of the invention, the header portions 11aa, 12aa shall be simply termed "header portions", and the header portions 11ab, 12ab will be termed "flange portions".

The header portions 11aa, 12aa and the flange portions 11ab, 12ab are disk-shaped. The cylindrical neck portions 11ac, 12ac are situated between the opposing disk-shaped header portions and flange portions so as to couple both the header portions to the flange portions. The lead portions 11b, 12b are joined to the flange portions 11ab, 12ab. The neck portions 11ac, 12ac and the lead portions 11b, 12b extend on an identical axis, and form an axial lead structure.

As shown by a partial sectioning of the electrode lead 12 in FIG. 1, each of the electrode leads 11, 12 is integrally formed into the lead portions, flange portions, neck portions, and header portions of an identical metal. An example of the forming process may be through press work.

The material of the electrode leads 11, 12 is copper containing no oxygen. This material has a coefficient of thermal expansion of $16 \times 10^{-6}/°$ C., which is much greater than the coefficient of thermal expansion of silicon which is $3.52 \times 10^{-6}/°$ C. Materials for electrode leads 11, 12 may also include a Cu—Zr alloy, a Cu—Sn alloy, a Cu—Zn alloy, a Cu—Ni alloy, Ni, Fe, and Ag. The coefficient of thermal expansion of these metals is within the range of $11 \times 10^{-6}/°$ C. to $20 \times 10^{-6}/°$ C.

The electrode leads 11, 12 are provided with a film 13 to which glass will not adhere, an example of which is a nickel film. The range over which the glass non-adherent film 13 extends may be, as shown in the figure, from the header portions 11aa, 12aa to the flange portions 11ab, 12ab over which the mold glass is provided. The film 13 may well also be disposed up to the lead portions 11b, 12b.

The silicon pellet 14 referred to above is arranged between the header portions 11aa and 12aa. On those surfaces of the header portions 11aa, 12aa over which the silicon pellet is secured, stoppers 15, 16, made of an iron-nickel alloy, molybdenum or tungsten, and having the same diameter as that of the header portions 11aa, 12aa, are placed in order to check or block mutual diffusion between copper and silicon. Mutual diffusion between copper and silicon renders the silicon pellet 14 fragile, and such diffusion may be caused by various heat treatments in the manufacturing process of the diode 10.

Fixing of the electrode leads 11, 12, the stoppers 15, 16, and the silicon pellet 14 is accomplished by soft solder 17-20, such as Pb—Ag—Sn system solder. The solder does not directly adhere to the silicon pellet 14, and hence, in using solder, intervening films of nickel, gold or the like (not shown) are provided on both surfaces of the silicon pellet 14.

The silicon pellet 14 has a $p^+$-$p$-$n^{30}$ or $p^+$-$n$-$n^+$ structure which executes diode action, and has a mesa geometry in which a p-n junction 14a is exposed toward the side periphery.

A mold glass 21 stabilizes the surface of the p-n junction 14a and protects the silicon pellet 14 from external stresses. The mold glass 21 may be of various known glass materials, and $ZnO$—$B_2O_3$—$SiO_2$ system glass may be advantageously selected, since the coefficient of thermal expansion of this glass is approximate to that of silicon.

As previously stated, the electrode leads 11, 12 are integrally formed by press work or the like. In particular, the header portions 11aa, 12aa and the flange portions 11ab, 12ab have equal diameters. If $D_1$ denotes these diameters, $D_2$ denotes the diameter of the neck portions 11ac, 12ac, and $D_3$ denotes the diameter of the lead portions 11b, 12b, the electrode leads are constructed so as to establish the relation of $D_1 > D_2 > D_3$. By way of example, $D_1$ may be 1.5 $\phi$mm, $D_2$ may be 1.2 $\phi$mm, and $D_3$ may be 0.8 $\phi$mm.

On the other hand, the surfaces of the stoppers 15, 16 are pre-cladded with solder material at 17, 18, 19 and 20. The thickness of the solder material 17-20 has a lower limit determined by the point of inferior fixation, and an upper limit by the point of an inferior withstand voltage, and may be made at a thickness of 10-80$\mu$. Regarding this thickness, it is premised that a standard pressure value, such as 0.19-0.62 g./mm$^2$, is applied to the silicon pellet 14 at soldering of the silicon pellet 14 and the electrode leads 11, 12.

When the electrode leads 11, 12, the silicon pellet 14 and the stoppers 15, 16 have been prepared, they are stacked in a vertical hole of a jig made of carbon in a stacking order of the electrode lead 11, stopper 15, silicon pellet 14, stopper 16 and electrode lead 12. This assembly is heated to about 300° C. at which the soft solder 17-20, applied on the stoppers 15, 16, fuses, whereupon the assembly is cooled to solidify the solder material. Thus, an assembled sub-assembly in which the silicon pellet 14 is held between the pair of electrode leads 11, 12 is obtained. Subsequently, glass slurry in which glass frits and distilled water or deionized water are mixed is applied to the silicon pellet 14. While rotating the sub-assembly, it is heated to about 700° C. at which the glass fuses to bake the mold glass 21 on the sub-assembly.

The solidification initiating temperature of the soft solder 17-20 is 200° C. or so. In actuality, therefore, even when the mold heating temperature of the glass is 700° C. or so, the solder material 17-20 is in the molten state, and the silicon pellet 14 is unsecured and has no fixed relation to the stoppers 15, 16 throughout a considerable temperature range at which the mold glass 21 solidifies. Therefore, almost no thermal stresses act on the silicon pellet 14.

During baking of the mold glass 21, the solder material 17-20 is in the molten state. Because of the surface tensions of the solder material 17-20, however, the electrode leads 11, 12, silicon pellet 14 and stoppers 15, 16 maintain the illustrated state of the sub-assembly and do not separate, so that the molding operation is easily carried out.

Since the glass non-adherent film 13 exists on the electrode leads 11, 12, the mold glass 21 does not rupture due to the difference between the thermal expansions of the mold glass 21 and the electrode leads 11, 12. Due to the difference of the thermal expansions, slight spaces $S_1$-$S_4$ are defined between the electrode leads 11, 12 and the mold glass 21. That is, by exploiting the fact that the coefficient of thermal expansion of the electrode leads 11, 12 is greater than the coefficient of thermal expansion of the mold glass 21, the mold glass 21 is sandwiched between the header portions 11aa, 12aa and the flange portions 11ab, 12ab, and the silicon pellet 14 is closed off from the external environment or atmosphere in such form.

In this invention, since the electrode portions 11a, 12a and the lead portions 11b, 12b are integrally molded of the same metal, the problem of corrosion, as occurs in the case of employing molybdenum or tungsten electrodes, is not involved. Further, since an inexpensive material, such as copper, is employed, the semiconductor device is economical.

In a case where molybdenum or tungsten is employed for the stoppers 15, 16, the stoppers themselves may be as thin as about 0.2 mm, to retain the economical advantage. In the case of using stoppers 15, 16 made of molybdenum or tungsten, it is also possible to employ a hard solder, such as aluminum, for the solder material 18, 19.

The thicknesses of the header portions 11aa, 12aa and the flange portions 11ab, 12ab may range from 0.2–0.4 mm or so, and the length of the neck portions 11ac, 12ac may be 0.7–1.0 mm or so.

The diameter of the neck portions 11ac, 12ac, which couple the header portions 11aa, 12aa and the flange portions 11ab, 12ab, is advantageously greater than that of the lead portions 11b, 12b. Thus, the lead portions 11b, 12b are sometimes bent during use of the diode 10, but the neck portions 11ac, 12ac are not bent together with the lead portions by the bending stresses exerted on the lead portions. Accordingly, the mold glass 21 is not damaged, and the airtightness is reliably maintained.

On the other hand, thermal resistances in the neck portions 11ac, 12ac are lower, and heat generated in the silicon pellet 14 is efficiently diffused through the electrode leads 11, 12, and generated heat in the electrode leads 11, 12 is small.

Also, since the mass of the neck portion is great, heat produced by surge currents can be absorbed by the neck portions 11ac, 12ac, and the withstand surge voltage of the silicon pellet 14 is enhanced.

Finally, the amount of deposition of the slurry glass to the sub-assembly can be increased, and it becomes possible to protect the silicon pellet 14 by large quantities of glass. Since the mold glass 21 may be thicker, damage of the mold glass 21 itself due to external stresses decreases.

In this embodiment, even when the header portions 11aa, 12aa and the stoppers 15, 16 have a difference in coefficients of thermal expansion, the solder material 17, 20 can endure thermal stresses. Unlike the solder material 18, 19, therefore, the solder material 17, 20 may be a hard solder.

The silicon pellet 14 is not restricted to the $p^+$-$p$-$n^+$ or $p^+$-$n$-$n^+$ structure including a rectifying (diode) action, but it may also be a silicon pellet including at least two p-n junctions, such as a $p^+$-$n$-$p^+$ or $n^+$-$p$-$n^+$ structure, exhibiting the punch-through type rectifying action, or a $p^+$-$n$-$p^+$-$n^+$ structure, exhibiting negative characteristics. In addition, a plurality of silicon pellets of a structure, being stacked and bonded by a hard or soft solder, can be held between the illustrated electrode leads with soft solder. Further, the mold glass 21 can be substituted by a resin material.

FIG. 2 illustrates a glass-molded diode 30 according to another embodiment of this invention. The differences of this embodiment from the embodiment shown in FIG. 1 are that the outside diameter $D_5$ of header portions 31aa, 32aa of electrode leads 31, 32 is made equal to the outside diameter of the smaller area side principal surface 34b (right principal surface as viewed in the figure) of a silicon pellet 34 of mesa geometry, and that the outside diameter $D_4$ of flange portions 31ab, 32ab is made equal to the outside diameter of the larger area side principal surface 34c (left principal surface as viewed in the figure) of the silicon pellet 34. The diameter of stoppers 35, 36 is made equal to that of the header portions 31aa, 32aa. Letting $D_6$ denote the outside diameter of cylindrical neck portions 31ac, 32ac and $D_7$ denote the outside diameter of lead portions 31b, 32b, the outside diameters $D_4$–$D_7$ of the various parts of the electrode leads 31, 32 have the relation of $D_4 > D_5 > D_6 > D_7$.

In the embodiment of FIG. 1, the stopper 16 overhangs the silicon pellet 14. A problem then may occur in that, because of an insufficient spread of the glass slurry onto this part, a void will be formed during baking of the mold glass 21, so that passivation of the p-n junction 14a will be hindered by this void, and the reverse withstand voltage will decrease. In contrast, the embodiment of FIG. 2 provides that the silicon pellet 34 overhangs the stopper 35, and that the silicon pellet 34 and the stopper 36 have no overhanging relation therebetween. Therefore, baking of the mold glass 41 does not result in formation of a void which hinders passivation of the p-n junction 34a.

Although, in the embodiments of FIGS. 1 and 2, the electrode leads and the stoppers are soldered, they may be also integrally formed by welding.

The stopper may cause an increase of the electric resistance and the thermal resistance. Therefore, it may be desirable to use a single member or part as both the stopper and the header portion in the electrode in order to reduce electrical and thermal resistances.

FIG. 3 shows an electrode lead which is fabricated according to the present invention. Referring to the Figure, the electrode lead 51 has no header portion, and a stopper 55 is welded to a neck portion 51ac. Alternatively, a solder material may be used for integrally forming the electrode lead 51 and the stopper 55. The electrode lead 51 is formed of, for example, copper, while the stopper 55 is formed of, for example, a ferroalloy. As in the case of FIG. 1, a nickel film 53 is provided on the surface of the electrode lead 51 in order to block or check the adherence of mold glass. The stopper 55 serves also as the header portion, and is provided with a film 55a of nickel, gold or the like, which enhances the adherence of a soft solder. Letting $D_8$ denote the diameters of the stopper 55 and a flange portion 51ab, $D_9$ the diameter of the neck portion 51ac and $D_{10}$ the diameter of a lead portion 51b, the relation among the outside diameters $D_8$–$D_{10}$ is $D_8 > D_9 > D_{10}$ in accordance with this invention.

As described above, the header portion and the stopper are formed in a single, unitary member in this embodiment, so that electrical and thermal resistances may be decreased from that in the electrode leads illustrated in FIGS. 1 and 2.

Now, a resin-molded diode according to this invention will be explained with reference to FIG. 4. In the Figure, resin-molded diode 60 is designated according to this invention. Electrode leads 61, 62 are made of copper, and the electrode leads 61, 62 include electrode portions 61a, 62a and lead portions 61b, 62b. The electrode portions 61a, 62a are constructed of header portions 61aa, 62aa, flange portions 61ab, 62ab and neck portions 61ac, 62ac. The neck portions 61ac, 62ac are provided with tour protrusions 61c, 62c in such a manner that the radially extending protrusions also extend axially between the header portions 61aa, 62aa and the flange portions 61ab, 62ab.

As in the embodiment shown in FIG. 1, the header portions 61aa, 62aa are provided with stoppers 65, 66 through a solder material 67, 68. Silicon pellets 64a–64e which conduct rectification are stacked and bonded between both header portions 61aa, 62aa by the use of solder materials 63a–63d and 68, 69. The solder material 63a–63d and the solder material 68, 69 may be either of the same sort or of different sorts.

The exposed ends of p-n junctions in the silicon pellets 64a–64e are covered with a surface stabilizing agent such as silicone varnish 70, the outer side of which is covered with a mold material, such as epoxy resin 71. The mold resin 71 is disposed over the assembly from the flange portion 61ab of the electrode lead 61 to the flange portion 62ab of the electrode lead 62.

In the embodiments shown in FIGS. 1–3, enhancement of mechanical strength in the neck portions is achieved by making the diameter of the neck portion larger than that of the lead portion, and thus, achieving a difference on the cross-sectional areas of both portions. On the other hand, in the embodiment of FIG. 4, mechanical strength is enhanced in the neck portions by providing protrusions 61c, 62c in the neck portions 61ac, 62ac, and thus, increasing the cross-sectional areas of these parts. The protrusions 61c, 62c also increase the contact areas with the mold resin 71, and improve the adhesion between the electrode leads 61, 62 and the mold resin 71. Simultaneously, the protrusions 61c, 62c function to resist against stresses in the circumferential direction, or turning forces, as may be externally applied to the mold resin 71. Thus, they serve to maintain airtightness of the silicon pellets 64a–64e.

The four protrusions 61c are disposed radially in four directions as shown in FIG. 5. In order to augment the mechanical strength, at least three protrusions 61d having an angle of 120° between adjacent protrusions need be disposed as illustrated in FIG. 6. In FIG. 6, the same symbols represent the same or corresponding parts, as in FIGS. 4 and 5.

The provision of protrusions on the neck portions 61ac, as shown in FIG. 4 or FIG. 6, is also applicable to the glass molding process.

For the resin molding process, the glass non-adherent film used in the glass molding process need not be provided on the electrode portions. In resin molding, it is inappropriate to characterize the maintaining of the airtightness by holding the mold resin 71 between the header portions and flange portions of the electrode portions, but the mold resin 71 does itself adhere closely to the elecrode portions, and increases the adhering area, thereby maintaining airtightness. Even when the lead portion is subjected to a bending stress, the neck portion does not bend, so that no separation or clearance results between the electrode portion and the mold resin 71, so that airtightness can be secured and maintained. As occurs in the embodiment of FIG. 1, the thermal resistance is low, and the withstand surge voltage is high.

The reason why, in FIG. 1, the diameter of the neck portion 11ac is made smaller than that of the flange portion 11ab, but larger than that of the lead portion 11b, is to render the cross-sectional area of the neck portion 11ac smaller than that of the flange portion 11ab and larger than that of the lead portion 11b, thereby enhancing the mechanical strength, as well as the withstand surge voltage, and reducing the thermal resistance. Therefore, insofar as the cross-sectional areas are provided in such relation, the configurations or shapes of the header portion 11aa, flange portion 11ab and neck portion 11ac need not be restricted to cylindrical cross-sections.

FIG. 7 shows an embodiment in which a header and flange portion 61ab and a lead portion 61b are circular in cross-section, taken in a direction orthogonal to the axially extending direction of a neck portion 61ac, while the neck portion 61ac has a square cross-section. Because of the square cross-section, corner parts 61e of the neck portion augment the contact area with the mold resin 71, and function as resistances against external stresses in the circumferential direction, similarly to the protrusions 61c, 61d in FIGS. 4–6. Of course, the shape of the neck portion 61ac is not restricted to a square, but any other polygon may be used. Needless to say, an electrode lead having such polygonal neck portion is also applicable to a glass-molded semiconductor device.

Further, the concepts of the electrode leads illustrated in FIGS. 4–7 are also applicable to the electrode lead, shown in FIG. 3, in which the stopper serves also as the header portion.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A molded semiconductor device with header leads, comprising:
   a. at least one semiconductor pellet having at least one p-n junction,
   b. a pair of electrode leads holding said semiconductor pellet therebetween, each of said electrode leads comprising;
      1. an electrode portion, and
      2. a connecting lead portion which is formed of the same metal as that of said electrode portion,
      3. said electrode portion including two tabular header portions separated from each other, and a columnar neck portion coupling both of said header portions between opposing surfaces thereof,
      4. said lead portion and said neck portion extending coaxially,
      5. said lead portion being joined to a first of said two header portions of said electrode portion,
      6. said neck portion having a cross-sectional area in a direction orthogonal to the axial direction which is larger than that of said lead portion,
      7. said semiconductor pellet being secured to the second of said two header portions of said electrode portion,
   c. first means including solder material for securing said semiconductor pellet to said second header portion of each of said electrode portions, and
   d. second means including mold material for encapsulating said semiconductor device from said first header portion of one of said electrode portions to said first header portion of the other electrode portion, so as to cover the entire periphery of said semiconductor pellet.

2. A molded semiconductor device with header leads according to claim 1, wherein said neck portion of said electrode portion of each of said electrode leads is provided with at least three protrusions axially extending from said first header portion to said second header portion.

3. A molded semiconductor device with header leads according to claim 1, wherein said neck portion of said electrode portion of each of said electrode leads has a polygonal cross-sectional configuration in said direction orthogonal to said axial direction.

4. A molded semiconductor device with header leads according to claim 1, wherein each of said electrode leads is integrally formed of a metal which has a coefficient of thermal expansion in the range of $11 \times 10^{-6}/°C$ to $20 \times 10^{-6}/°C$, and wherein said electrode leads having those portions in contact with said mold material is provided with a glass non-adherent film, said mold material being a glass.

5. A molded semiconductor device with header leads according to claim 4, wherein each of said electrode leads is formed of copper or a copper alloy, said semiconductor pellet is composed of silicon, and wherein stopper means for checking mutual diffusion between copper and silicon are respectively disposed between said second header portions of said electrode leads and said semiconductor pellet, said stopper means being secured to said second header portions of said electrode leads and said semiconductor pellet by said solder material.

6. A molded semiconductor device with header leads according to claim 5, wherein said stopper means are composed of a ferro-alloy, molybdenum or tungsten.

7. A molded semiconductor device with header leads according to claim 4, wherein said semiconductor pellet has a mesa geometry.

8. A molded semiconductor device with header leads according to claim 7, wherein said second header portion of said electrode portion has a diameter which is equal to that of a principal surface of said semiconductor pellet at a smaller area side of said semiconductor pellet, and which is larger than that of said neck portion.

9. A molded semiconductor device with header leads according to claim 1, wherein said mold material is a synthetic resin.

10. A molded semiconductor device with header leads, comprising:
   a. at least one semiconductor pellet having at least one p-n junction,
   b. a pair of electrode leads holding said semiconductor pellet therebetween, each of said electrode leads comprising;
      1. an electrode portion including two tabular header portions separated from each other, and a columnar neck portion coupling said two header portions between opposing surfaces thereof, and
      2. a connecting lead portion extending coaxially with said columnar neck portion of said electrode portion, said lead portion being joined to a first of said header portions of said electrode portion,
      3. said semiconductor pellet being secured to a second of said header portions of said electrode portion,
      4. said first header portion, said neck portion of said electrode portion, and said connecting lead portion being integrally formed together of an identical metal, wherein a cross-sectional area of said neck portion in a direction orthogonal to the axial direction is larger than that of said lead portion,
   c. first means including solder material for securing said semiconductor pellet to said second of said header portions of said electrode portions, and
   d. second means including mold material for enclosing said device from said first header portion of one of said electrode portions to said first header portion of the other electrode portion, so as to cover the entire periphery of said semiconductor pellet.

11. A molded semiconductor device with header leads according to claim 10, wherein said neck portion of each of said electrode leads is provided with at least three protrusions extending from said first header portion to said second header portion.

12. A molded semiconductor device with header leads according to claim 10, wherein said neck portion of each of said electrode leads has a polygonal cross-sectional configuration in said direction orthogonal to said axial direction.

13. A molded semiconductor device with header leads according to claim 10, wherein:
   1. said first header portion, said neck portion and said lead portion of each of said electrode leads are formed of copper or a copper alloy.
   2. said semiconductor pellet is composed of silicon, and
   3. said second header portion of each of said electrode leads is made of a metal which checks mutual diffusion between copper and silicon.

14. A molded semiconductor device with header leads according to claim 13, wherein said second header portion of each of said electrode leads is composed of a ferro-alloy, molybdenum or tungsten.

15. A molded semiconductor device with header leads according to claim 10, wherein:
   1. said mold material is glass, and
   2. said first header portion of each of said electrode leads and said neck portion having contact with said mold glass are provided with a glass non-adherent film.

16. A molded semiconductor device with header leads according to claim 10, wherein said semiconductor pellet has a mesa geometry.

17. A molded semiconductor device with header leads according to claim 10, wherein said second header portion of each of said electrode leads has a diameter which is equal to that of a principal surface of said semiconductor pellet at a smaller area side thereof, and which is larger than that of said neck portion.

18. A molded semiconductor device with header leads according to claim 10, wherein said mold material is a synthetic resin.

19. A method of manufacturing a mold semiconductor device with header leads comprising the steps of:
   a. arranging at least one semiconductor pellet having at least one p-n junction between a pair of electrode leads, said semiconductor pellet and said pair of electrode leads having a different coefficient of thermal expansion,
   b. securing said semiconductor pellet to said electrode leads by using an intermediate material having a predetermined melting temperature, and
   c. encapsulating said semiconductor pellet in a molding material at a temperature greater than said predetermined temperature, so that thermal stresses are substantially eliminated on said semiconductor pellet.

20. A molded semiconductor device with header leads, comprising:
 a. at least one semiconductor pellet,
 b. a pair of electrode leads holding said semiconductor pellet therebetween, each of said electrode leads comprising:
  1. an electrode portion including first and second tabular header portions separated from each other, and a neck portion coupling said two header portions between opposing surfaces thereof,
  2. a connecting lead portion extending coaxially with said neck portion of said electrode portion, said lead portion being joined to said first header portion of said electrode portion, and
  3. said connecting lead portion, said first header portion, said neck portion, and said second header portion being sequentially formed in order and being formed integrally together of an identical metal, wherein said neck portion has a cross-sectional area in a direction orthogonal to the axial direction larger than that of said lead portion,
 c. stopper means being disposed between said second header portions of said electrode leads and said semiconductor pellet for preventing mutual diffusion therebetween,
 d. first means including solder material for securing said semiconductor pellet to said stopper means, and
 e. second means including mold material for enclosing said device from said first header portion of one of said electrode portions to said first header portion of the other electrode portion, so as to cover the entire periphery of said semiconductor pellet.

21. A molded semiconductor device with header leads according to claim 20, wherein said neck portion of each of said electrode leads is provided with at least three protrusions extending from said first header portion to said second header portion.

22. A molded semiconductor device with header leads according to claim 20, wherein said neck portion of each of said electrode leads has a polygonal cross-sectional configuration in said direction orthogonal to said axial direction.

23. A molded semiconductor device with header leads, comprising:
 a. at least one semiconductor pellet having at least one p-n junction,
 b. a pair of electrode leads holding said semiconductor pellet therebetween, each of said electrode leads including an electrode portion having two tabular header portions separated from each other, a neck portion coupling said two header portions between opposing surfaces thereof, and a connecting lead portion extending coaxially with said neck portion of said electrode portion, said lead portion being joined to a first of said header portions of said electrode portion, wherein said neck portion has a cross-sectional area in a direction orthogonal to the axial direction which is largar that than of said connecting lead portion,
 c. first means for securing said semiconductor pellet to a second of said header portions of said electrode portions, and
 d. second means including mold material for enclosing said device from said first header portion of one of said electrode portions to said first header portion of the other electrode portion, so as to cover the entire periphery of said semiconductor pellet.

24. A molded semiconductor device according to claim 23, wherein at least said connecting lead portion, said first of said header portions, and said neck portion are integrally formed together of the same material.

* * * * *